United States Patent
Nakano et al.

[11] Patent Number: 5,089,839
[45] Date of Patent: Feb. 18, 1992

[54] METHOD OF PROCESSING PRE-SENSITIZED LITHOGRAPHIC PRINTING PLATE AND APPARATUS THEREFOR

[75] Inventors: Miegi Nakano, Chofu; Minoru Seino, Hachioji; Masafumi Uehara, Kokubunji; Akira Nogami, Hino, all of Japan

[73] Assignee: Konishiroku Photo Industry Co., Ltd., Tokyo, Japan

[21] Appl. No.: 561,456

[22] Filed: Aug. 1, 1990

Related U.S. Application Data

[62] Division of Ser. No. 346,279, May 1, 1989, Pat. No. 4,963,473, which is a division of Ser. No. 53,862, May 26, 1987, abandoned.

[30] Foreign Application Priority Data

May 27, 1986 [JP] Japan ................. 61-121725

[51] Int. Cl.$^5$ ............................................. G03D 3/08
[52] U.S. Cl. ................... 354/317; 354/320; 15/77; 15/102
[58] Field of Search ............... 354/317, 320, 322, 324, 354/325; 430/309; 15/77, 100, 102

[56] References Cited

U.S. PATENT DOCUMENTS

| | | | |
|---|---|---|---|
| 3,589,261 | 6/1971 | Krikelis | 354/325 |
| 3,995,343 | 12/1976 | Horner | 354/297 |
| 4,119,991 | 10/1978 | Martino | 354/320 |
| 4,145,135 | 3/1979 | Sara | 354/317 |
| 4,148,576 | 4/1979 | Martino | 354/325 X |
| 4,215,927 | 8/1980 | Grant | 354/317 |
| 4,371,250 | 2/1983 | Wakabayashi et al. | 354/325 |
| 4,428,659 | 1/1984 | Howard | 354/317 |
| 4,464,035 | 8/1984 | Schoering | 354/322 |

*Primary Examiner*—A. A. Mathews
*Attorney, Agent, or Firm*—Finnegan, Henderson, Farabow, Garrett, and Dunner

[57] ABSTRACT

An apparatus for processing an imagewise exposed pre-sensitized lithographic printing plate which entails uniformly applying a desired amount of developer, that has not been substantially used to the surface of the printing plate by a developer supply member comprised of two plates and having a slit at the lowermost portion thereof which contacts the surface of the printing plate, and then transferring the plate containing the developer to a developer storage tank, immersing the plate in the developer storage tank, and removing the developer from the plate.

9 Claims, 2 Drawing Sheets

METHOD OF PROCESSING PRE-SENSITIZED LITHOGRAPHIC PRINTING PLATE AND APPARATUS THEREFOR

This is a division of U.S. application Ser. No. 346,279, filed May 1, 1989, now U.S. Pat. No. 4,963,473, which is in turn a continuation of application Ser. No. 053,862, filed May 26, 1987, now abandoned.

FIELD OF THE INVENTION

The present invention generally relates to a method of developing a pre-sensitized lithographic printing plate (hereinafter referred to as PS plate) and an apparatus therefor, and more particularly, to an improved method of developing a PS plate by means of an automatic developing machine which supplies a non-used developer each time a PS plate is developed.

BACKGROUND OF THE INVENTION

Normally, an automatic developing machine is used to develop many exposed PS plates.

In order to develop many exposed PS plates, the following two methods have been adopted. One is to spray a developer on PS plates while they are transferred in a horizontal direction. The other is to immerse PS plates by bending them in a developing tank which contains a large quantity of a developer while they are transferred. In these methods, it is necessary to prepare large quantities of a developer in developing one PS plate. A developer is recycled in these methods. As a result, the developer is deteriorated due to repeated developments of PS plates as well as absorption of carbon dioxide, which necessitates the deteriorated developer to be replaced, and as such, makes a developing operation very troublesome.

In order to solve the disadvantage caused by the above-described method, methods of stably developing PS plates by recycling a large quantity of a developer have been developed in the art. In these methods, a replenisher is supplied to prevent a developer from being deteriorated. These methods are disclosed in Japanese Patent Publication Open to Public Inspection (hereinafter referred to as Japanese Patent O.P.I. Publication) Nos. 144502/1975, 115039/1980, and 95349/1983. In these methods, though the frequency of a developer exchange is reduced, it is still necessary to exchange a developer. Further, a replenisher is not necessarily supplied with required accuracy. In addition, it is very troublesome to adjust the amount of a replenisher according to the dimension of the PS plates to be developed. Furthermore, it is necessary to provide a replenishing device which is expensive and care must be taken so that the replenishing device may work in a good condition.

An apparatus intended to eliminate the need for supplying a replenisher and reduce the amount of a developer to be used was disclosed in Japanese Patent O.P.I. Publication No. 32044/1980. The apparatus is provided with a developer diffusion plate adjacent to a PS plate-transfer path mounted in an automatic developing machine whereby a developer applied to a PS plate spreads entirely over the PS plate. According to this method of developing PS plates using a small amount of a developer, an uneven development occurs unless a relatively large amount (300–500 ml/m$^2$) of a developer is supplied. Even if a relatively large amount of a developer is supplied, residual film of 0.5 mm in width are formed at the top portion and side edge portions of the PS plates.

It is therefore an object of the present invention to provide a method of developing PS plates whereby the top and side edge portions of the PS plates are reliably developed using a small amount of a developer and a developing apparatus which performs this developing method.

SUMMARY OF THE INVENTION

The present invention relates to a novel method of developing PS plates by automatically transferring them using an automatic developing machine comprising the steps of supplying, a developer not substantially used, with the PS plates, and thereafter, allowing the photosensitive PS plates to pass through a developer storage tank.

A developing apparatus, according to the present invention, which performs the above-described method by automatically transferring PS plates comprises a supply means for uniformly supplying a developer with the PS plates in the width direction thereof; a developer storage tank; a transfer means for transferring the PS plates with which a developer was supplied in such a condition that the developer is held on the PS plates, and allowing the PS plates to pass through the developer storage tank.

DETAILED DESCRIPTION OF THE INVENTION

The detailed description of the present invention will be described according to the embodiments shown in the accompanying drawings.

Figure 1:
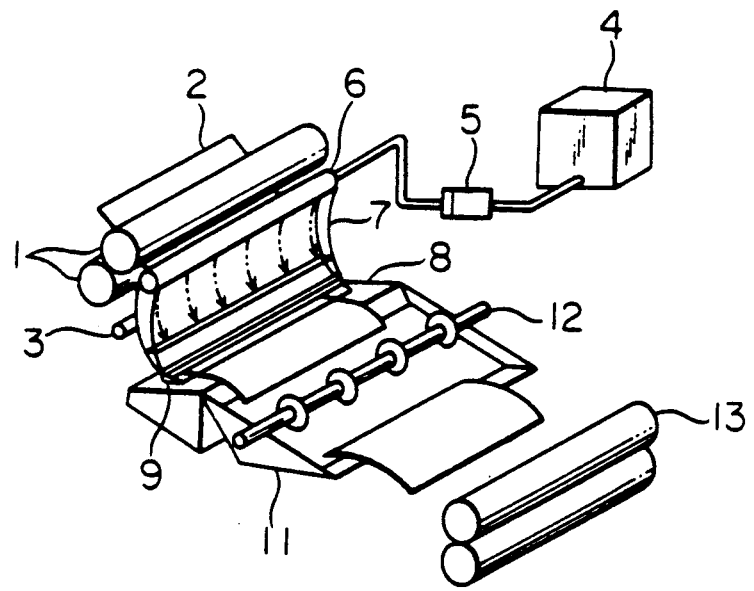
FIG. 1 is a perspective view showing a developing apparatus according to one embodiment of the present invention.
Figure 2:
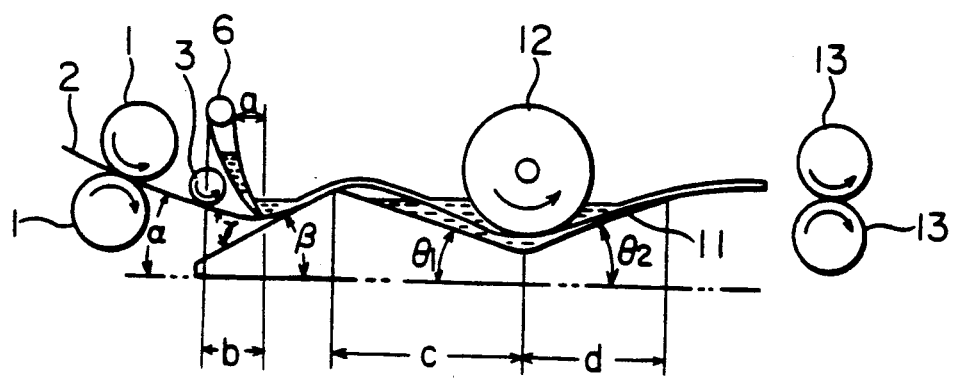
FIG. 2 and 3 are cross-sectional views of a developing apparatus according to one embodiment of the present invention.

In FIGS. 1 and 2, numeral 1 shows a pair of transfer rollers which transfers a PS plate 2 by nipping it in a horizontal direction. The transfer roller 1 is so mounted on the apparatus that it forms an angle downwards relative to the horizontal direction. Numeral 3 shows a presser roller for transferring the PS plate 2 reliably. Numeral 4 shows a developer storage tank which stores a developer not substantially used. Numeral 5 shows a developer transfer pump for transfer ring the developer by applying pressure to it to a developer supply pipe 6. The developer supply pipe 6 is provided with a plurality of holes at a side thereof for allowing the developer to flow from it. Numeral 7 shows a developer supply member which is composed of two plates and has a slit at the lowermost portion thereof. The clearance dimension of the slit can be adjusted depending on the amount of a developer fed from the developer supply pipe 6. Numeral 8 shows an inclined plate 8. The lowermost portion of the developer supply member 7 is in contact with the face of the inclined plate 8 so that a concave formed at a portion between the lowermost portion of the developer supply member 7 and the inclined plate 8 may act as a developer reservoir 9 when the PS plate 2 is not passing therebetween. A pair of the transfer rollers 1 and the pressure roller 3 are mounted on the apparatus so that the top portion of the PS plate 2 penetrates between the portion where the lowermost portion of the developer supply member 7 is in contact with the inclined plate 8.

The material for the developer supply member 7 includes plastic sheets consisting of such as polyester, polyvinyl chloride, polypropylene, polyethylene, and polystyrene; metal sheets such as stainless steel; and rubber sheets.

If the plates which compose the slit consist of non-flexible material or so hard as to damage the PS plate 2, it is preferable that the lowermost portion of the plates are so positioned that the plates do not contact with the PS plate 2.

The slit is so constructed that its clearance is automatically adjusted of a developer on the amount of a developer to be supplied by the developer supply pipe 6 if one of the two plates is flexible. Hence, the construction of the apparatus is simple.

One of the preferred embodiments according to the present invention is that each of the two plates which form the slit at the lowermost portion thereof has flexible portions in the direction parallel with the PS plate-transfer face and perpendicular to the PS plate-transfer direction and that the lowermost portion of the exit side plate in the PS plate-transfer direction is shorter (preferably in the range from 3–10 mm) than the inlet side plate relative to the PS plate.

The angle $\alpha$, to be formed between the PS plate and the horizontal plane 10 at the time when the top portion of the PS plate 2 touches the pressure roller 3 after it has passed between a pair of the carrier roller 1, is 0° or an acute angle. More favorably, it is in the range from 0° to 30°. The angle $\beta$ to be formed between the inclined plate 8 and the horizontal plate 10 is preferably in the range from 5° to 45°. The angle $\gamma$ to be formed between the inclined plate 8 and the PS plate 2 is preferably in the range from 5° to 45°.

The apparatus is provided with a developer storage tank 11 and a guide roller 12 in the rear (in the transfer direction) of the inclined plate 8. The PS plate 2 which has passed the developer storage portion 9 passes the rear portion of the inclined plate 8, and then, is immersed in the developer stored in the developer storage tank 11. Numeral 13 designates a squeeze roller.

As shown in FIG. 2, the angle $\theta_1$ is favorably in the range from 5° to 90°. More favorably, it is in the range from 10° to 45°. The angle $\theta_2$ is favorably in the range from 5° to 90°. More favorably, it is in the range from 20° to 60°. The ratio of c to d is preferably in the range from 1:1 to 1:0.2. Favorably, the diameter of the guide roller 12 is in the range from 40 to 200 mm. More favorably, it ranges from 60 to 120 mm.

Of metals such as stainless steel, plastic such as rigid vinyl chloride, and rubber to be normally used as the materials for the developer storage tank 11, stainless steel is most favorable.

The period of time $t_1$, from the point when the PS plate 2 is supplied with a developer 2 by the developer supply member 7 until the point the PS plate is immersed in the developer stored in the developer storage tank 11, is preferably in the range from 5 to 10″. The period of time $t_2$ while the PS plate 2 is in the developer stored in the developer storage tank 11 is preferably in the range from 5 to 10″. The period of time $t_3$ between point the PS plate 2 is removed from the developer stored in the developer storage tank 11 and the point the developer is removed from the PS plate 2 is preferably in the range from 1 to 4″. The developing temperature is preferably in the range from 10° to 40° C.

Another preferred modification of the developer supply member comprising two plates is as follows: The exit side plate of the developer supply member having the slit formed at the lowermost portion thereof is removed, and a developer is allowed to flow from the holes provided with the developer supply pipe so that the developer is allowed to flow down the inlet side plate and is supplied to the PS plate 2.

According to the present invention, it is preferable that the PS plate 2 is supplied with a developer by the developer supply means in the same thickness on the entire surface of the PS plate 2 and that the PS plate 2 is simultaneously supplied with the developer in the width direction (perpendicular to the PS plate 2-transfer direction) developer supply means is not limited only to the above-described developer supply member provided with the slit formed by the two plates. The angle of inclination $\beta$ to be formed by the horizontal plane and inclined plate 8 may be in the range from 0° to 5°. In this arrangement, a developer to be stored in the developer reservoir 9 is formed by the surface tension of the developer in the portion where the developer supply member 7 is in contact with the plate 8.

The operation of the apparatus of the present invention will be described hereinafter.

When the top portion of PS plate 2 penetrates between a pair of the carrier roller 1, the PS plate detection switch (not shown in the drawings) actuates the transfer roller 1, the presser roller 3, the guide roller 12, and the squeeze roller 13 so as to transfer the PS plate 2. When the PS plate detection switch detects the penetration of the PS plate into the apparatus, the PS plate detection switch actuates the developer transfer pump 5 whereby the period of time and the amount to be supplied to the developer supply pipe 6 is controlled.

A developer which has flowed from a plurality of the holes mounted on the developer supply pipe 6 flows down along the internal sides of the two plates composing the developer supply member 7. Each time a developer flows down along the internal sides of the two plates, flowing of the developer is stopped by the slit located in the vicinity of the lowermost portion of the plates, with the result that the developer is stored there and the developer is applied uniformly to the PS plate. The two-dot chain lines in FIG. 1 show the direction in which the developer flows down.

The preferable amount of a developer to be supplied to the PS plate 2 is preferably in the range from 50 to 500 ml and more preferably, 50 to 300 ml per 1 $m^2$ of the PS plate 2.

The PS plate 2 is transferred along the upper surface of the plate 8 and a developer is applied to the PS plate by the developer supply member 7. The PS plate t which the developer has been applied is transferred, with the developer held thereon, until it reaches the developer storage tank 11 where it is immersed in the developer stored in the developer storage tank 11. The PS plate is developed by the two developers with no residual films formed on the top portion and both side edges of the PS plate. It is preferable that the developer applied to the PS plate 2 is held thereon from the time when the PS plate passes the developer reservoir 9 until the PS plate 2 is immersed in the developer stored in the developer storage tank 11.

According to the method of the present invention, each time the PS plate is transferred to the slit, the PS plate is supplied with a developer not substantially used. By a developer not used is meant a developer not used to develop PS plates. A developer not substantially used means a developer whose capability of developing PS plates in use is the same as that of a developer not used.

According to the present invention, a developer to be stored in the developer storage tank maybe the same as that to be used in the slit. In order to recover a developer deteriorated due to the treatment of PS plates and the absorption of carbon dioxide, the period of times $t_1$, $t_2$, and $t_3$ are set so that the capability of the developer in the developer storage tank is maintained by the developer brought in and out by PS plates. If a developer is deteriorated to such an extent that the deterioration cannot be recovered, a developer is exchanged or replenished. The amount of a developer to be put in the developer storage tank is favorably in the range from 0.5 to 3 liter per 1 $m^2$ of PS plate.

According to the present invention, after PS plates are supplied with a developer at the slit, development acceleration means may be applied to PS plates. The development accelerating means include various means such as physical means, chemical means, electrical means, and mechanical means.

The following mechanical development accelerating means are available according to the present invention. The method of rubbing the surfaces of PS plates by a rotatable roller shaped rubbing member; rubbing the surfaces thereof by rotating a flat rubbing member; rubbing the surfaces thereof by moving a flat rubbing member longitudinally and/or crosswisely; rubbing the surfaces thereof by moving and rotating a roller-shaped or flat rubbing member longitudinally and/or crosswisely. These rubbing members may be used in combination. A brush, sponge, cloth or the like can be the materials for these rubbing members.

Besides the above-described development accelerating means, the following methods are available for accelerating the development of PS plates: The method of spraying highly pressurized air; irradiating ultrasonic wave; vibrating PS plates; subjecting PS plates to electrochemical treatment as disclosed in Japanese Patent Publication O.P.I. No. 42042/1983; heating a developer placed on PS Plates in a moment by means of a microwave irradiation; honing PS plates using a treating solution containing abrasive powder.

Figure 3:
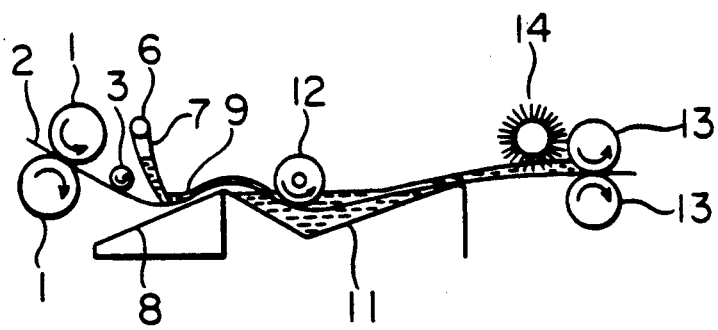

One preferred embodiment according to the present invention will be described hereinafter. The apparatus is provided with a rotatable brush roller as a development accelerating means for rubbing the surfaces of PS plates between the developer storage tank and the squeeze roller which removes a developer from PS plates. As shown in FIG. 3, it is preferable in this case that a brush roller 13 is disposed directly before a squeeze roller 13 and a developer, which has been squeezed by the squeeze roller 13, is stored in the brush roller 14 so as to accelerate development by rubbing PS plates by the rotation of the brush roller 14.

A waste solution resulting from a development according to the present invention may be treated by any desired means.

An automatic developing machine according to the present invention may be equipped with any necessary devices after a development is carried out, e.g., devices for a washing, desensitizing treatment by means of a water solution containing surface active agents either independently or in combination thereof.

It is preferable to mount a waste solution storage tank in order to temporarily store the waste solution which result from the development and treatment before they are wasted. The PS plates to be used according to the present invention are classified into two types: In one type of PS plate, a photosensitive substance, whose solubility in a soluble varies when subjected to optical irradiation, is applied to the support of a PS plate. In the other type of PS plates, a soluble substance, where an imagewise registration layer can be provided by means of electrophotographic method, is provided on the support of a PS plate.

The indispensable photosensitive substances contained in the above-described photosensitive layer are represented by the following: Photosensitive diazo compounds; photosensitive azide compounds; compounds containing ethylene type unsaturated double bonds; epoxy compounds which are polymerized by acid catalysts; compounds in which a compound which releases an acid under the action of an actinic irradiation is combined with a compound consisting of silyl ether polymer and group C—O—C. The photosensitive diazo compounds include positive type compounds namely, o-quinone diazide compounds which is changed pounds, namely, o-quinone diazide compounds which is changed into alkali-soluble compounds by an exposure and negative compounds, namely, aromatic diazonium salts whose solubility in a developer is reduced by the exposure.

The developers for negative type PS plates to be used according to the present invention include anion surface active agents as disclosed in Japanese Patent O.P.I. Publication Nos. 77401/1976, 80228/1976, 44202/1978, and 52054/1980; organic solvents whose solubilities in water are less than 10 weight percentage at room temperature; alkali agents; water solution which may contain stain-preventive agents as necessary.

The developers for positive type PS plates to be used according to the present invention include hydroxides of alkali metals; silicates of alkali metals; phosphates of alkali metals; aluminates of alkali metals; a strong alkali water solution in which surface active agents and additives may be contained and the pH is more than 12.

Sodium silicate or potassium silicate as disclosed in the following Japanese Patent O.P.I. Publications are preferably used according to the present invention. They are Japanese Patent O.P.I. Publications Nos. are 15535/1973, 82334/1978, 62004/1979, 127338/1977, 96307/1978, 144502/1975, 22759/1980, 25100/1980, 95946/1980, 115039/1980, 115039/1980, 142528/1981, and 51324/1975.

The developer which acts both as the negative type PS plate and the positive type PS plate may also be used according to the present invention.

EXAMPLES

Examples according to the present invention will be described hereinafter.

EXAMPLE 1

The apparatus used in this embodiment is as shown in FIG.

1. The dimensions of the plates which form a slit were as follows:

The upper plate (positioned at the exit side):

Thickness, 75 $\mu m$; length (perpendicular to a transfer direction), 900 mm; width (a in FIG. 2), 50 mm. The lower plate (positioned at the inlet side):

Thickness, 175 μm; length, 900 mm; width (b in FIG. 2), 55 mm. Both plates are rectangular sheets consisting of polyethylene terephthalate.

Plate 8 was made of stainless plate (thickness; 2 mm). The angle β formed between the horizontal line and the plate 8 was 20°. The distance from the point where the developer supply member 7 contacts with the inclined plate 8 to the end portion of the inclined plate 8 was 50 mm. The angle of approach of a PS plate to the point the developer supply member 7 contacts with the inclined plate 8 was 20°. The transfer length of the developing portion was 400 mm. The composition of the developer which was put in the developer storage tank 11 was the same as that of the developer supplied by supply member 7. A developer which was supplied to a PS plate by the developer supply member 7 flowed into the developer storage tank 11. The apparatus was so constructed that an excessive amount of the developer was stored in a waste solution storage tank. The temperature of the developer was 20° C. The period of times $t_1$, $t_2$, and $t_3$ were eight seconds, eight seconds, and four seconds, respectively.

The type of the PS plate used in this embodiment was SMP-N (trade name; positive type-PS plate manufactured by Konishiroku Photo Industry Co., Ltd.) and its size was 1003 mm ×800 mm. The composition of the developer was as follows:

| | |
|---|---|
| Solution of potassium silicate (mol ratio of $SiO_2$ $K_2O$ was 1.0. Concentration of $SiO_2$; two weight percentage) | 500 g |
| PELEX NBL (sodium alkyl naphthalene sulfonate manufactured by KAO ATLAS CO., LTD.) | 0.25 g |
| Water | 500 g |

The amount of a developer supplied to the PS plate was 160 ml per plate. One hundred PS plates were sequentially developed. The first and 100th PS plates were subjected to offset printings, with the result that no stain was observed either on the top portion or both side edges of the PS plates.

COMPARISON 1

Figure 4:
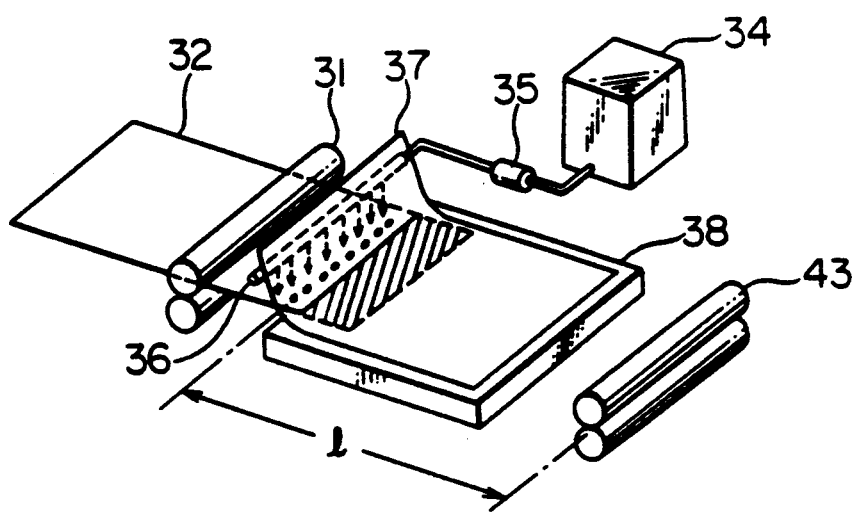
FIG. 4 is a perspective view showing a developing apparatus used comparison.

Using PS plates and a developer similar to that used in the above-described embodiment, developments were carried out by the apparatus shown in FIG. 4. A developer was applied dropwise from the nozzles of the developer supply pipe 36 to the PS plates. The developer thus applied to the PS plates spreaded on the PS plates with the diffusion plate 37. The PS plates thus developed were transferred along the guide plate 38.

In the above-described development, the distance between the point where the developer was applied dropwise to the PS plates and a pair of the rollers 43, i.e., the developing zone 1 was 400 mm. The developing period of time was 20 seconds. The amount of the developer applied to per PS plate was 160 ml. One hundred PS plates were sequentially developed, with the result that the developer spreaded on the PS plates uniformly, however, the PS plates were unevenly developed and residual films were formed on the top portion and both side edge portions of the PS plates. The PS plates thus developed were printed in the same condition as that of Example 1, with the result that stains were observed on the residual film portions.

According to the method and apparatus, a PS plate can be developed without giving rise to no residual films in the top portion and both side edges of the PS plate using a small amount of a developer.

What is claimed is:

1. An apparatus for processing an imagewise exposed pre-sensitized lithographic printing plate comprising:
   means for storing a first developer;
   means for supplying uniformly said first developer onto a surface of said printing plate in an amount of 50 to 500 ml per square meter of said printing plate, wherein said first developer has not been substantially used and said supply means contacts said surface of said printing plate;
   means for transferring said printing plate bearing said first developer;
   means for supplying a second developer onto said surface of said printer plate; and
   a developer removing means positioned downstream from said supply means for said second developer.

2. The apparatus of claim 1, wherein said supply means for said first developer comprises two plates having a lowermost portion which contacts the surface of said printing plate, said first developer being supplied through said lowermost portion to said surface of said printing plate.

3. The apparatus of claim 2, wherein said lowermost portion is a flexible portion.

4. The apparatus of claim 1, further comprising means for accelerating development of said printing plate.

5. The apparatus of claim 2, further comprising means for accelerating development of said printing plate.

6. The apparatus of claim 4, wherein said means for accelerating development comprises a roller-shaped or flat rubber member.

7. The apparatus of claim 5, wherein said means for accelerating development comprises a roller-shaped or flat rubber member.

8. The apparatus of claim 4, wherein said means for accelerating development comprises a rotatable brush roller.

9. The apparatus of claim 5, wherein said means for accelerating development comprises a rotatable brush roller.

* * * * *

UNITED STATES PATENT AND TRADEMARK OFFICE
CERTIFICATE OF CORRECTION

PATENT NO.   : 5,089,839
DATED        : February 18, 1992
INVENTOR(S)  : Miegi NAKANO et al.

It is certified that error appears in the above-identified patent and that said Letters Patent is hereby corrected as shown below:

Claim 1, column 8, line 28, change "printer" to --printing--.

Signed and Sealed this

Twenty-second Day of June, 1993

Attest:

MICHAEL K. KIRK

*Attesting Officer*                    *Acting Commissioner of Patents and Trademarks*